Figure 1:
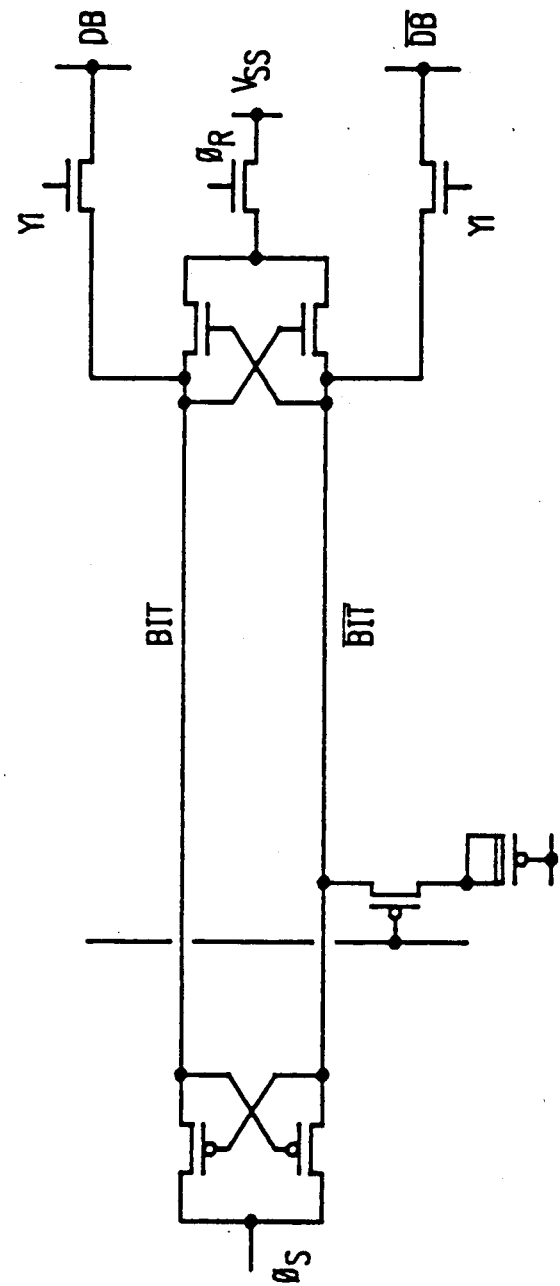

United States Patent [19]

Foss

[11] Patent Number: 5,042,012
[45] Date of Patent: Aug. 20, 1991

[54] SERIAL ACCESS DYNAMIC RAM

[75] Inventor: Richard C. Foss, Kirkcaldy Fife, Scotland

[73] Assignee: Mosaid, Inc., Ontario, Canada

[21] Appl. No.: 497,267

[22] Filed: Mar. 22, 1990

[51] Int. Cl.[5] ............................................. G11C 13/00
[52] U.S. Cl. ........................... 365/230.04; 365/189.12; 365/189.04
[58] Field of Search ....................... 365/189.12, 230.04, 365/78, 219, 239, 240, 202, 189.04

[56] References Cited

U.S. PATENT DOCUMENTS 3,763,480  10/1973  Weimer ........................... 365/189.01
3,772,658  11/1973  Sarlo .................................... 365/238

Primary Examiner—Terrell W. Fears
Attorney, Agent, or Firm—Antonelli, Terry, Stout & Kraus

[57] ABSTRACT

A dynamic random access memory having a serial access data port. A plurality of complimentary bitline pairs are provided for receiving data signals from a plurality of memory cells, and a plurality of latches are connected to respective ones of the bitline pairs for periodically sensing and restoring the data signals in the memory cells. Predetermined ones of the latches are connected together via a plurality of isolation transfer gates which are enabled according to a predetermined timing sequence for unidirectionally shifting the data signals therebetween according to a master-slave action.

11 Claims, 3 Drawing Sheets

Basic Clock Sequence. (ØP1, ØT2, ØP2, ØT1 in 4-phase seq.)

Note ØP's must not overlap ØT's
ØP1 must not overlap ØR1
ØP2 must not overlap ØR2

SERIAL ACCESS DYNAMIC RAM

This invention relates in general to semiconductor memory devices and more particularly to a serial access dynamic random access memory.

Serial access random access memories (RAMs) have recently become popular for use as video screen memories for storing data to be displayed on a cathode ray tube (CRT) or other visual display hardware. Accordingly, such serial access dynamic RAMs have become commonly known as video RAMs.

In addition to the serial access characteristic of such video RAMs, depending on the system requirements, it may also be necessary to retain full random access of the memory, in which case the memories are classed as dual port video RAMs. An example of such a memory is disclosed in U.S. Pat. No. 4,330,852 (Texas Instruments Incorporated).

According to the prior art Texas Instruments device, a shift register is included in addition to the normal X and Y decoder of a standard dynamic RAM, so as to allow the column lines to be serially scanned.

Prior art single port video RAMs which lack the normal Y-decode function are also well known and are, for example, disclosed in an article by R.C. Foss entitled "Silicon! The Future Mass Memory?", published in *Proceedings of National Electronic Conference*, p. 257, October, 1975. The article of R.C. Foss also discloses a single port video RAM utilizing a conventional Y-decoder but including a counter circuit to sequentially access the columns.

A principal disadvantage of prior art video RAMs such as described in the Texas Instruments patent or the article by R.C. Foss, is the requirement for either a separate shift register for scanning the column line, or its equivalent Y-decoder plus counter. The complex circuitry required to implement such functions contributes to silicon area usage, resulting in additional costs in terms of raw materials (i.e. chip area) as well as production costs (i.e. additional fabrication steps).

According to the present invention, a method is provided for serially accessing single or dual port video RAMs by interconnecting and shifting data signals between the existing sense and restore amplifiers of the RAM'S according to a master/slave action for serially shifting data out from the RAM.

Therefore, in accordance with the present invention, a single port video RAM can be constructed with considerable savings in circuit complexity and silicon area by eliminating the need for a separate shift register or its equivalent Y-decoder plus counter function, as disclosed in the prior art. Moreover, a dual port video RAM can be constructed in accordance with the present invention without the need for a separate shift register, such that the silicon circuit area is comparable to that of a standard DRAM.

In general, according to the present invention there is provided a method of serially shifting data signals out of a dynamic RAM, wherein the dynamic RAM is comprised of a plurality of complementary bitline pairs for receiving data signals from a plurality of memory cells connected thereto, and a plurality of latches connected to respective ones of the bitline pairs for periodically sensing and restoring the data signals in the memory cells. The method comprises the steps of receiving the data signals from alternate ones of the bitline pairs and storing the data signals in the respective ones of the latches, and repetitively transferring the data signals stored in each of the respective latches to adjacent ones of the latches, thereby shifting out the data signals from the dynamic RAM.

In accordance with a further embodiment of the present invention there is provided a circuit for serially shifting data signals out of a dynamic RAM, wherein the dynamic RAM is comprised of a plurality of complementary bitline pairs for receiving the data signals from a plurality of memory cells connected thereto, and a plurality of latches connected to respective ones of the bitline pairs for periodically sensing and restoring the data signals in the memory cells. Circuitry is provided for receiving the data signals from alternate ones of the bitline pairs and storing the data signals in the respective ones of the latches, and circuitry is also provided for unidirectionally and repeatedly transferring the data signals from each of the respective latches to successive adjacent ones of the latches, thereby serially shifting the data signals out from the dynamic RAM.

According to yet a further embodiment of the present invention, a circuit is provided for serially shifting out data signals from a dynamic RAM, wherein the dynamic RAM is comprised of a plurality of complementary bitline pairs for receiving data signals from a plurality of memory cells connected thereto, and a plurality of latches connected to respective ones of the bitline pairs for periodically sensing and restoring the data signals in the memory cells, wherein the bitline pairs and respective latches are arranged in alternate even and odd columns. The circuit for serially shifting out the data signals is comprised of a timing signal generator for generating a plurality of periodic control signals, a serial data output terminal connected to an endmost one of the latches, and a first plurality of isolation transfer gates for receiving a first one of the control signals and in response periodically transferring the data signals from the bitline pairs arranged in one of either the odd or even columns for storage in the respective latches. Circuitry is also provided for receiving a second one of the control signals and in response precharging respective inputs of the latches arranged in the other one of the odd or even columns. A second plurality of isolation transfer gates are provided for receiving a third one of the control signals and in response transferring the data signals stored in the respective latches arranged in the aforementioned one of the odd or even columns to respective adjacent ones of the latches arranged in the other one of the odd or even columns, whereby the data signals are serially shifted via the latches toward the serial data output terminal. Circuitry is included for receiving a fourth one of the control signals and in response enabling the latches arranged in the other one of the odd or even columns, for storing the data signals therein. Further circuitry is included for receiving a fifth one of the control signals and in response periodically precharging respective inputs of the latches arranged in the aforementioned one of the odd or even columns. A third plurality of isolation transfer gates is provided for receiving a sixth one of the control signals and in response transferring the data signals from the respective latches in the other one of the odd or even columns to respective adjacent ones of the latches in the aforementioned one of the odd or even columns, whereby the data signals are successively serially shifted via the latches out of the serial data output terminal, and additional circuitry is included for receiving a seventh one of the control signals and in response enabling the latches in the aforementioned one of the odd or even columns for storing the data signal therein, whereby the data signals are unidirectionally shifted between respective ones of the latches in the odd and even columns, and out the serial output terminal connected to the endmost one of the latches.

Figure 2:
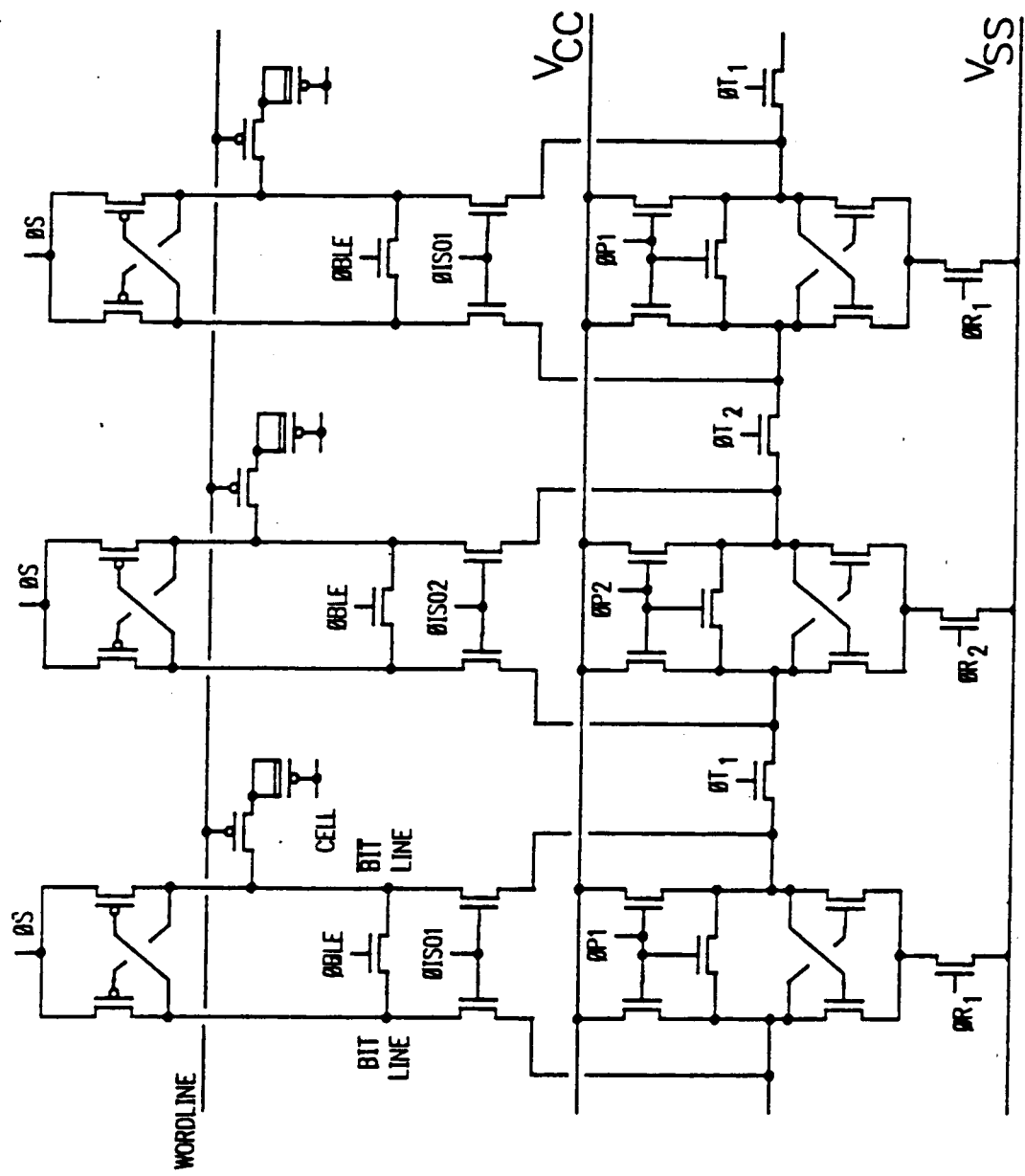
Figure 3:
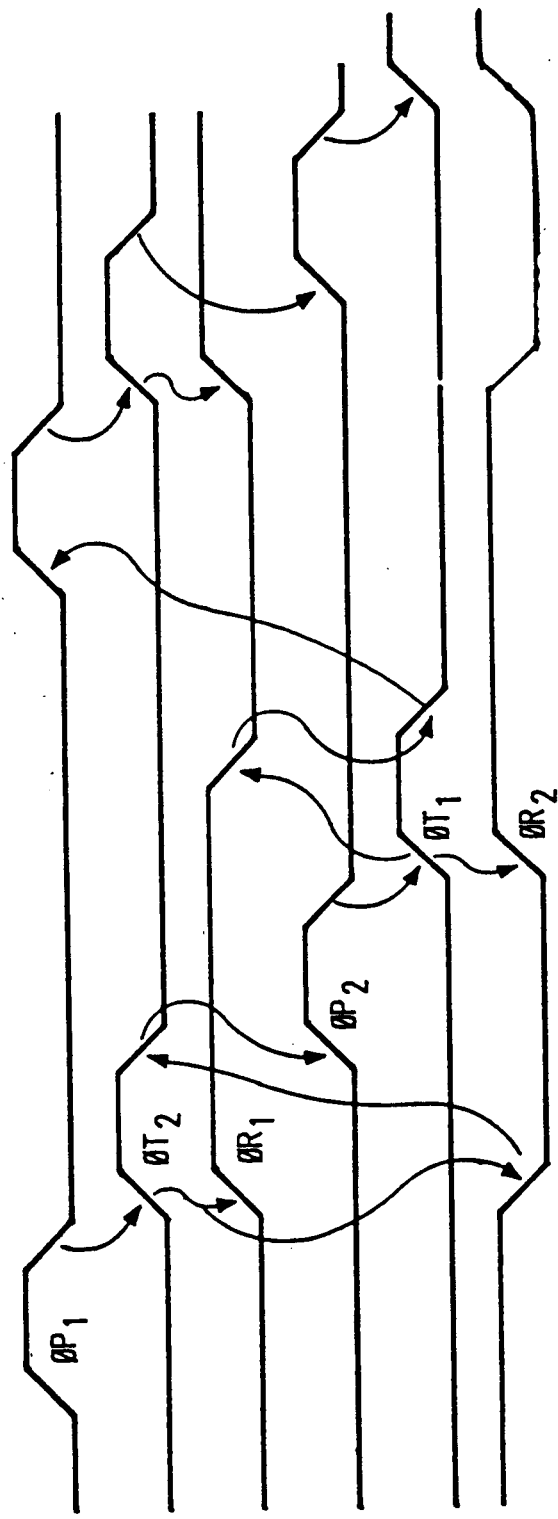

A better understanding of the present invention will be provided with reference to the detailed description below in conjunction with the following drawings in which FIG. 1 is a simplified circuit diagram illustrating a single memory cell connected to sense and restore latches via a folded bitline pair, according to the prior art, FIG. 2 is a circuit diagram illustrating series connection of three adjacent restore latches for serially shifting data out from a dynamic RAM, in accordance with the present invention, and FIG. 3 is a timing diagram illustrating control signals applied to various elements of the circuit shown in FIG. 2, in accordance with the present invention.

Turning to FIG. 1, a simplified folded bitline dynamic RAM is illustrated having a single P-channel memory cell comprised of a storage capacitor 1 and a cell access transistor 3 having a gate terminal connected to a wordline 5. A source terminal of cell access transistor 3 is connected to the first bitline half 7B of a folded bitline pair 7A and 7B (BIT, BIT).

Although only a single memory cell is shown, typically either 128 or 256 of such cells are connected to alternate halves of the folded bitline pair 7A and 7B, and are activated by respective additional wordlines in a well known manner. For ease of description, the additional memory cells are not shown.

The bitline pair 7A and 7B are connected at one end to a P-channel cross-coupled pair of transistors 9A and 9B which form a voltage sense latch or flip-flop, and at the other end to N-channel cross-coupled transistors 11A and 11B which form a voltage restore latch or flip-flop. The bitlines 7A and 7B are also connected together for charge sharing via a further N-channel transistor 13, as described in greater detail below.

During the active cycle of DRAM operation (i.e. the RAS cycle), charge stored on the memory cell is transferred to bitline 7B such that a voltage differential is developed between respective halves of the bitline pair 7A and 7B. The voltage sense latch (9A and 9B) is enabled in response to receiving a logic high $0_S$ signal for pulling the higher voltage on one of the bitlines 7A or 7B to a full logic high supply voltage ($V_{CC}$) while the end channel restore latch (11A and 11B) is enabled in response to receiving a logic low enable signal ($V_{ss}$) via transistor 16 (i.e. a logic high $0_R$ signal being applied to the gate input of N-channel transistor 16), for pulling the lower voltage one of the bitlines 7A or 7B to a full low supply voltage ($V_{SS}$).

Further N-channel transistors 14 and 15 are enabled throughout the active cycle (RAS) by means of coded row address signals $Y_i$ in a well known manner. As a result, the differential charge appearing on bitlines 7A and 7B is applied to respective databus lines DB and DB for reading data from and writing data to the selected memory cell (i.e. capacitor 1 and cell access transistor 3).

According to the present invention, the restore flip-flops 11A and 11B are interconnected as shown in greater detail below with reference to FIG. 2, and enabled via a predetermined timing sequence to function as series elements of a scanning shift register, as shown in FIG. 3. By using the restore flip-flops to serially shift data instead of including additional circuit elements such as shift registers, counters, etc., as in the prior art, the circuit of the present invention benefits from excellent economy of components. This is particularly important since additional circuitry such as shift registers or counters which are added for the purpose of allowing serial access as in the prior art, are difficult to fit into the pitch of the bitlines in a practical chip layout.

As is well known, a standard shift register requires a master/slave action with two latches or other storage sites per bit of information to be shifted. Accordingly, the restore flip-flops of the standard video RAM, are operated in accordance with the present invention in response to the predetermined timing sequence shown in FIG. 3, for shifting data signals between the restore flip-flops according to a master/slave action.

Turning now to FIG. 2, a preferred circuit implementation of the present invention is illustrated for using active restore flip-flops to serve as a serial readout shift register. According to the illustrated embodiment, P-channel memory cells 20, 22 and 24 are shown connected to respective bitline pairs 26, 28 and 30 connected to respective P-channel sense amplifiers 32, 34 and 36 and N-channel cross-coupled restore flip-flops 38, 40 and 42.

As discussed above, the respective bitline pairs 26, 28 and 30 are interconnected via additional N-channel transistors 44, 46 and 48 for performing bitline charge equalization during the active operating cycle of the dynamic RAM. Also, as discussed with reference to FIG. 1, respective ones of the restore amplifiers 38, 40 and 42 are connected to the source of logic low level supply voltage $V_{SS}$ via respective transistors 50, 52 and 54.

However, in addition to the well known circuitry discussed with reference to FIG. 1, additional circuit elements are provided, consisting of isolation transfer gates 56, 58 and 60; N-channel precharge and equalize transistors 62, 64 and 68 connected to the source of logic high supply voltage ($V_{CC}$) and respective ones of the restore flip-flops 38, 40 and 42; and N-channel isolation transfer gates 70, 72 and 74 for transferring data signals between adjacent columns of bitline pairs.

Although only three columns of bitline pairs are illustrated for convenience, typically up to 128 or 256 such columns are arranged in succession, each column including 128 or 256 rows of memory cells.

In operation, to perform a serial readout of data stored in the memory cells a conventional midpoint sensing operation is performed by which respective ones of the bitline pairs 26, 28 and 30 are charge equalized at near midpoint (i.e. ($V_{cc}-V_{ss}/2$) in response to a logic high $0_{BLE}$ signal being applied to the transistors 44, 46 and 48. Next, the selected wordline 5 falls to an active low level such that charge stored in the respective memory cells 20, 22 and 24 is transferred to the bitline pairs for raising or lowering the respective bitlines connected thereto, as a function of the logic levels of the charges stored within the respective memory cells.

The sensing clock signals $0_S$ then rises to a logic high level such that the higher voltage one of the bitlines of each bitline pair is latched to the $0_S$ supply level via respective ones of the sense amplifiers or flip-flops 32, 34 and 36.

Next, both the $0_{ISO1}$ and $0_{ISO2}$ signals go from logic low to logic high levels for enabling the isolation transfer gates 56, 58 and 60. The $0_{R1}$ and $0_{R2}$ control signals each go to a logic high level for enabling transistors 50, 52 and 54, and thereby connecting the restore flip-flops 38, 40 and 42 to the logic low supply voltage ($V_{SS}$). In consequence thereof, full logic low level charges are restored on the lower voltage one of the bitlines of each bitline pair 26, 28 and 30, and corresponding memory cells. The wordline 5 then goes to a logic high level, (or remains active low, as required).

All of the above-noted steps are well known in the operation of prior art folded bitline dynamic RAM circuits.

Turning to FIG. 3, the serial readout operation is performed for firstly reading out the data stored in the odd columns of memory cells (e.g. cells 20, 24, etc.), and thereafter serially shifting out the data stored on the alternate even columns of memory cells (e.g. memory cell 22, etc.).

Firstly, the $0_{R2}$ signal goes from a logic high to a logic low level for turning off the even column transistors (e.g. transistor 52, etc.) $0_{P2}$ goes to a logic high level for precharging and equalizing the even numbered restore flip-flops (e.g. flip-flop 40, etc.) via the precharge and equalize transistors (e.g. transistor 64, etc.) Thus, both inputs (i.e. source terminals) of the cross-coupled N-channel transistors (e.g. flip-flop 40) are precharged and equalized to a voltage of $V_{CC}-V_{TN}$, where $V_{TN}$ is equal to the threshold voltage drop across the source-drain channel of the N-channel transistors (such as transistor 64).

Next, $0_{T1}$ changes from a logic low to a logic high level for enabling the isolation transfer gates (e.g. 70, 74, etc.) in order to transfer one of either a logic "1" ($V_{CC}-V_{TN}$), or a logic "0" signal ($V_{SS}$) to the even numbered stages (e.g. 40, etc.)

Therefore, the even numbered stages serve as "slave" flip-flops while the odd numbered stages (e.g. 38, 42, etc.) function as "master" flip-flops. It should be noted that the nominal voltage level of the transferred "1" signal is equal to the precharge level applied to the restore flip-flop source terminals. However, charges added as the $0_{T1}$ signal rises, and the extra capacitance on the node connecting transistors 70 and 74, etc. to the corresponding even numbered stages 40, etc., ensures that a logic "1" signal is unambiguously sensed in response to the logic high $0_{R2}$ signal.

Next, the phased sequence of clock cycles shifts out the data that was originally loaded from the odd columns. More particularly, the $0_{P1}$ signal goes to a logic high level for equalizing and precharging the odd numbered stages 38, 42, etc.; the $0_{T2}$ signal goes to a logic high level along with the $0_{R1}$ signal for transferring data from the master flip-flops 40, etc. to the odd stage slave flip-flops 38, 42, etc.

This process is repeated until all of the data from the odd columns of memory cells 20, 24, etc., has been serially shifted out from an endmost one of the restore flip-flops to a serial data port 80.

Next, the $0_{ISO2}$ signal goes to a logic high level for enabling the even column isolation transfer gates (e.g. transistor 58, etc.), such that data carried by the respective even column bitline pairs is parallel loaded into the associated restore latches (e.g. flip-flop 40, etc.). The serial readout of data from the even numbered restore latches is performed in the same fashion as discussed above, with the odd column restore latches serving as slave flip-flops.

In summary, a principal advantage of the present invention is that, in addition to ellimination of the prior art need for a separate shift register, the resultant improvement in chip layout space requirements contributes to significant fabrication and materials cost reductions. Since the transfer element transistors 70, 72 and 74 between adjacent restore flip-flops isolates these flip-flops from one another at all times except during serial transfer of data signals therebetween, no increased circuit pitch is required over existing forms of prior art DRAM restore flip-flop circuits.

A person understanding the present invention may conceive of other embodiments or variations therein, without departing from the sphere and scope of the present invention.

For example, although the illustrated preferred embodiment utilizes folded bitlines, the invention may advantageously be applied to open bitline or other designs of dynamic RAMs. Also, while the preferred embodiment teaches use of restore flip-flops for effecting serial transfer of data signals, the sense amplifiers or flip-flops can alternatively be used. Similarly, while the preferred embodiment discloses P-channel memory cells and sense amplifiers and N-channel restore latches, it is contemplated that N-channel memory cells with N-channel sense and P-channel restore amplifiers may be used in accordance with the principles of the present invention. Moreover, although not shown in FIG. 2, well known parallel random access of data signals may be accommodated in conjunction with the serial access of the present invention, resulting in a dual port video RAM.

All such embodiments or variations are believed to be within the sphere and scope of the present invention as defined by the claims appended hereto.

I claim:

1. In a dynamic RAM comprised of a plurality of complementary bitline pairs for receiving data signals from a plurality of memory cells connected thereto, and a plurality of latches connected to respective ones of said bitline pairs for periodically sensing and restoring said data signals in said memory cells, a method of serially shifting said data signals out of said dynamic RAM, comprising the steps of receiving said data signals from alternate ones of said bitline pairs and storing said data signals in said respective ones of said latches, and repetitively unidirectionally transferring said data signals stored in each said respective latches to adjacent ones of said latches, thereby shifting out said data signals from said dynamic RAM.

2. A method as defined in claim 1, further comprising the steps of applying predetermined equalized voltages to respective inputs of said adjacent latches, for precharging said inputs prior to transferring said data thereto.

3. A method as defined in claim 2, further including the step of isolating said respective and adjacent latches from each other except during said step of transferring said data signals.

4. In a dynamic RAM comprised of a plurality of complementary bitline pairs for receiving data signals from a plurality of memory cells connected thereto, and a plurality of latches connected to respective ones of said bitline pairs for periodically sensing and restoring said data signals in said memory cells, a circuit for serially shifting said data signals out of said dynamic RAM, comprised of:

(a) means for receiving said data signals from alternate ones of said bitline pairs and storing said data signals in said respective ones of said latches, and (b) means for unidirectionally and repeatedly transferring said data signals from each said respective latches to successive adjacent ones of said latches, thereby serially shifting said data signals out from said dynamic RAM.

5. A circuit as defined in claim 4, wherein said means for receiving said data signals is comprised of a first plurality of isolation transfer gates connected to said bitline pairs and said respective latches, alternate ones of said gates being simultaneously enabled for transferring said data signals to said respective latches.

6. A circuit as defined in claim 5, wherein said means for repetitively transferring said data signals is comprised of a second plurality of isolation transfer gates connected between said respective latches and said successive adjacent ones of said latches, alternate ones of said second plurality of gates being simultaneously enabled for transferring said data signals from said respective latches to said adjacent latches.

7. A circuit as defined in claim 4, 5 or 6, further comprised of means for applying a precharge voltage to respective inputs of said successive adjacent ones of said latches for precharging said inputs prior to transferring said data signals.

8. A circuit as defined in claim 6, wherein each of said latches is comprised of a pair of cross-coupled field effect transistors each having drain terminals connected to a source of low level supply voltage via a further isolation transfer gate, and gate terminals of each said pair of transistors being connected to source terminals of the other of said pair of transistors, said source terminals also being connected to corresponding ones of said first plurality of isolation transfer gates.

9. A circuit as defined in claim 8, further comprised of means for applying a precharge voltage to said source terminals of the transistors comprising said successive adjacent ones of said latches, for precharging the inputs of said adjacent latches prior to transferring said data signals.

10. A circuit as defined in claim 9, wherein said means for applying said precharge voltage is comprised of transistor means for selectively connecting said source terminals of the transistors comprising said adjacent latches to a source of high level supply voltage.

11. In a dynamic RAM comprised of a plurality of complementary bitline pairs for receiving data signals from a plurality of memory cells connected thereto, and a plurality of latches connected to respective ones of said bitline pairs for periodically sensing and restoring said data signals in said memory cells, said bitline pairs and respective latches being arranged in alternate even and odd columns; a circuit for serially shifting out said data signals from said RAM, comprised of:

(a) timing signal generator means for generating a plurality of periodic control signals, (b) a serial data output terminal connected to an endmost one of said latches, (c) a first plurality of isolation transfer gates for receiving a first one of said control signals and in response periodically transferring said data signals from said bitline pairs arranged in one of either said odd or even columns for storage in said respective latches, (d) means for receiving a second one of said control signals and in response precharging respective inputs of said latches arranged in the other one of said odd or even columns, (e) a second plurality of isolation transfer gates for receiving a third one of said control signals and in response transferring said data signals stored in said respective latches arranged in said one of the odd or even columns to respective adjacent ones of said latches arranged in the other one of said odd or even columns, whereby said data signals are successively serially shifted via said latches out of said serial data output terminal, (f) means for receiving a fourth one of said control signals and in response enabling said latches arranged in the other one of said odd or even columns, for storing said data therein, (g) means for receiving a fifth one of said control signals and in response periodically precharging respective inputs of said latches arranged in said one of said odd or even columns, (h) a third plurality of isolation transfer gates for receiving a sixth one of said control signals and in response transferring said data signals from said respective latches in the other one of said odd or even columns to respective adjacent ones of said latches in said one of said odd or even columns, whereby said data signals are successively serially shifted via said latches out of said serial data output terminal, and (i) means for receiving a seventh one of said control signals and in response enabling said latches in said one of said odd or even columns for storing said data signals therein, whereby said data signals are unidirectionally shifted between respective ones of said latches in said odd and even columns, and out said serial output terminal connected to said endmost one of the latches.

* * * * *